(12) United States Patent
Tu et al.

(10) Patent No.: US 7,271,083 B2
(45) Date of Patent: Sep. 18, 2007

(54) ONE-TRANSISTOR RANDOM ACCESS MEMORY TECHNOLOGY COMPATIBLE WITH METAL GATE PROCESS

(75) Inventors: Kuo-Chi Tu, Hsin-Chu (TW); Kuo-Chyuan Tzeng, Chu-Pei (TW); Chung-Yi Chen, Hsinchu (TW); C. Y. Shen, Yunlin County (TW); Chun-Yao Chen, Hsin-Chu (TW); Hsiang-Fan Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 212 days.

(21) Appl. No.: 10/896,491

(22) Filed: Jul. 22, 2004

(65) Prior Publication Data

US 2006/0017115 A1    Jan. 26, 2006

(51) Int. Cl.
*H01L 29/76* (2006.01)
(52) U.S. Cl. .............................. 438/597; 257/E21.651; 257/E21.018; 257/E21.011
(58) Field of Classification Search ............... 438/597, 438/243; 257/371
See application file for complete search history.

(56) References Cited

U.S. PATENT DOCUMENTS

| | | | | |
|---|---|---|---|---|
| 5,780,332 A | * | 7/1998 | Ozaki .......................... 438/238 |
| 6,001,716 A | | 12/1999 | Liao | |
| 6,034,401 A | * | 3/2000 | Hsia et al. ................... 257/369 |
| 6,096,597 A | | 8/2000 | Tsu et al. | |
| 6,140,688 A | * | 10/2000 | Gardner et al. ............. 257/412 |
| 6,271,084 B1 | | 8/2001 | Tu et al. | |
| 6,300,211 B1 | * | 10/2001 | Togo ........................... 438/386 |
| 6,329,234 B1 | | 12/2001 | Ma et al. | |
| 6,333,533 B1 | * | 12/2001 | Furukawa et al. .......... 257/301 |
| 6,350,635 B1 | * | 2/2002 | Noble et al. ................ 438/156 |
| 6,387,772 B1 | * | 5/2002 | Chittipeddi et al. ........ 438/386 |
| 6,413,815 B1 | * | 7/2002 | Lai et al. ..................... 438/243 |
| 6,551,915 B2 | * | 4/2003 | Lin et al. ..................... 438/598 |
| 6,656,785 B2 | * | 12/2003 | Chiang et al. .............. 438/240 |
| 6,699,749 B1 | * | 3/2004 | Lee et al. .................... 438/240 |
| 6,809,363 B2 | * | 10/2004 | Yu et al. ...................... 257/296 |
| 7,002,199 B2 | * | 2/2006 | Fukuzumi ................... 257/296 |
| 7,144,769 B2 | * | 12/2006 | Chan et al. ................. 438/243 |
| 2002/0005538 A1 | * | 1/2002 | Leutzen et al. ............. 257/301 |
| 2002/0102810 A1 | * | 8/2002 | Iizuka et al. ................ 438/396 |
| 2003/0181006 A1 | * | 9/2003 | Schrems ..................... 438/243 |

OTHER PUBLICATIONS

Leung, W., et al., "The Ideal SoC Memory: 1T-SRAM™," IEEE, Apr. 2000, pp. 32-36.

* cited by examiner

*Primary Examiner*—Michael Lebentritt
*Assistant Examiner*—Thu-Huong Dinh
(74) *Attorney, Agent, or Firm*—Slater & Matsil, L.L.P.

(57) ABSTRACT

One-transistor RAM technology compatible with a metal gate process fabricates a metal gate electrode formed of the same metal material as a top electrode of a MIM capacitor embedded isolation structure. A gate dielectric layer is formed of the same high-k dielectric material as a capacitor dielectric of the MIM capacitor embedded isolation structure.

21 Claims, 16 Drawing Sheets

US 7,271,083 B2

ONE-TRANSISTOR RANDOM ACCESS MEMORY TECHNOLOGY COMPATIBLE WITH METAL GATE PROCESS

TECHNICAL FIELD

The present invention relates to a memory technology, and particularly to a metal gate process compatible with a metal-insulator-metal (MIM) capacitor process.

BACKGROUND

Typical memory cells are created comprising one single Metal-Oxide-Semiconductor Field-Effect-Transistor (MOSFET) as a switching device connected with a capacitor as a digital data storage device, thus commonly referred to as a 1T-RAM device. A capacitor known as a metal-insulator-metal (MIM) structure possesses a low-interfacial reaction specificity to enhance its performance. The MIM capacitor has therefore become an important topic of research for memory technology. Leung, et al., "The Ideal SoC Memory: 1T-SRAM" 0-7803-6598 4/00, IEEE pp. 32 to 36, is incorporated herein by reference. U.S. Pat. No. 6,096,597 to Tsu, et al., U.S. Pat. No. 6,329,234 to Ma, et al., and U.S. Pat. No. 6,271,084 to Tu, et al. also incorporated herein by reference, describe MIM capacitor processes.

A gate electrode of the MOS transistor serves as part of that memory device wiring. As feature sizes of semiconductor devices continue to be scaled to smaller dimensions, it is desirable to reduce the resistance of gate electrode lines as much as possible, and the use of conventional gate electrode material is becoming increasingly problematic. In particular, the use of the gate electrode to align source/drain implants imposes significant limitations on the gate electrode material, such as polysilicon, which can withstand high temperatures of the source/drain annealing and prevent dopants from reacting with the channel region of the underlying silicon substrate. However, the polysilicon gate electrode has drawbacks of polysilicon depletion, voltage leakage, and high resistance. In an effort to overcome these problems, metals or refractory metal alloys are alternative materials currently being investigated for use as gate electrodes. These metallic materials offer potential advantages over polysilicon because of their pattern ability, low sheet resistance, and scalability to advanced MOS technologies. U.S. Pat. No. 6,001,716 for "Fabrication Method of a Metal Gate," incorporated herein by reference, discloses a metal gate including a plurality of titanium nitride layers.

SUMMARY OF THE INVENTION

Embodiments of the present invention include a 1T-RAM technology compatible with a metal gate process to form a metal gate electrode and a MIM capacitor embedded isolation structure for improved electrical performance and simplified processing. In certain advantageous embodiments of the present invention, the metal gate electrode is formed of the same metal materials as a top electrode of the MIM capacitor embedded isolation structure. Also, a gate dielectric layer is formed of the same dielectric material as a capacitor dielectric of the MIM capacitor embedded isolation structure.

In one aspect, the present invention provides for a semiconductor device having a substrate with a first region and a second region. An isolation structure is formed in the substrate of the first region. A capacitor embedded in the isolation structure comprises a bottom electrode layer, a capacitor dielectric layer formed overlying the bottom electrode layer, and a top electrode layer formed overlying the capacitor dielectric layer. A transistor formed overlying the substrate of the second region comprises a gate dielectric layer and a gate electrode layer formed overlying the gate dielectric layer. The top electrode layer is formed of the same metal material as the gate electrode layer. The capacitor dielectric layer is formed of the same metal material as the gate dielectric layer.

In another aspect, the present invention provides for a fabrication method for a self-aligned metal gate electrode, comprising the steps as follows. A substrate is provided with a first trench isolation structure and a second trench isolation structure. A transistor is formed overlying the substrate outside the first trench isolation structure and the second trench isolation structure, wherein the transistor comprises a dummy gate dielectric layer and a dummy gate electrode layer formed overlying the dummy gate dielectric layer. A first dielectric layer is formed overlying the substrate to cover the first trench isolation structure and the second trench isolation structure and surround the transistor. A first trench and a second trench pass through the first dielectric layer to reach a portion of the first trench isolation structure and a portion of the second trench isolation structure, respectively. A first metal layer is formed on the sidewall and bottom of the first trench and the second trench, respectively. The dummy gate electrode layer and the dummy gate dielectric layer are removed to form an opening in the first dielectric layer. A second dielectric layer is formed overlying the substrate to cover the first metal layer and the sidewall and bottom of the opening. A second metal layer is formed overlying the second dielectric layer to fill the first trench, the second trench and the opening. Portions of the second metal layer and the second dielectric layer are removed until the second metal layer remaining in the first trench and the second trench is leveled off with, i.e., made planar to, the second metal layer remaining in the opening. The second metal layer remaining in the opening serves as a self-aligned gate electrode.

BRIEF DESCRIPTION OF THE DRAWINGS

The aforementioned preferred embodiments, features and advantages of this invention will become apparent by referring to the following detailed description of the preferred embodiments with reference to the accompanying drawings, wherein.

DETAILED DESCRIPTION OF ILLUSTRATIVE EMBODIMENTS

Figure 1:
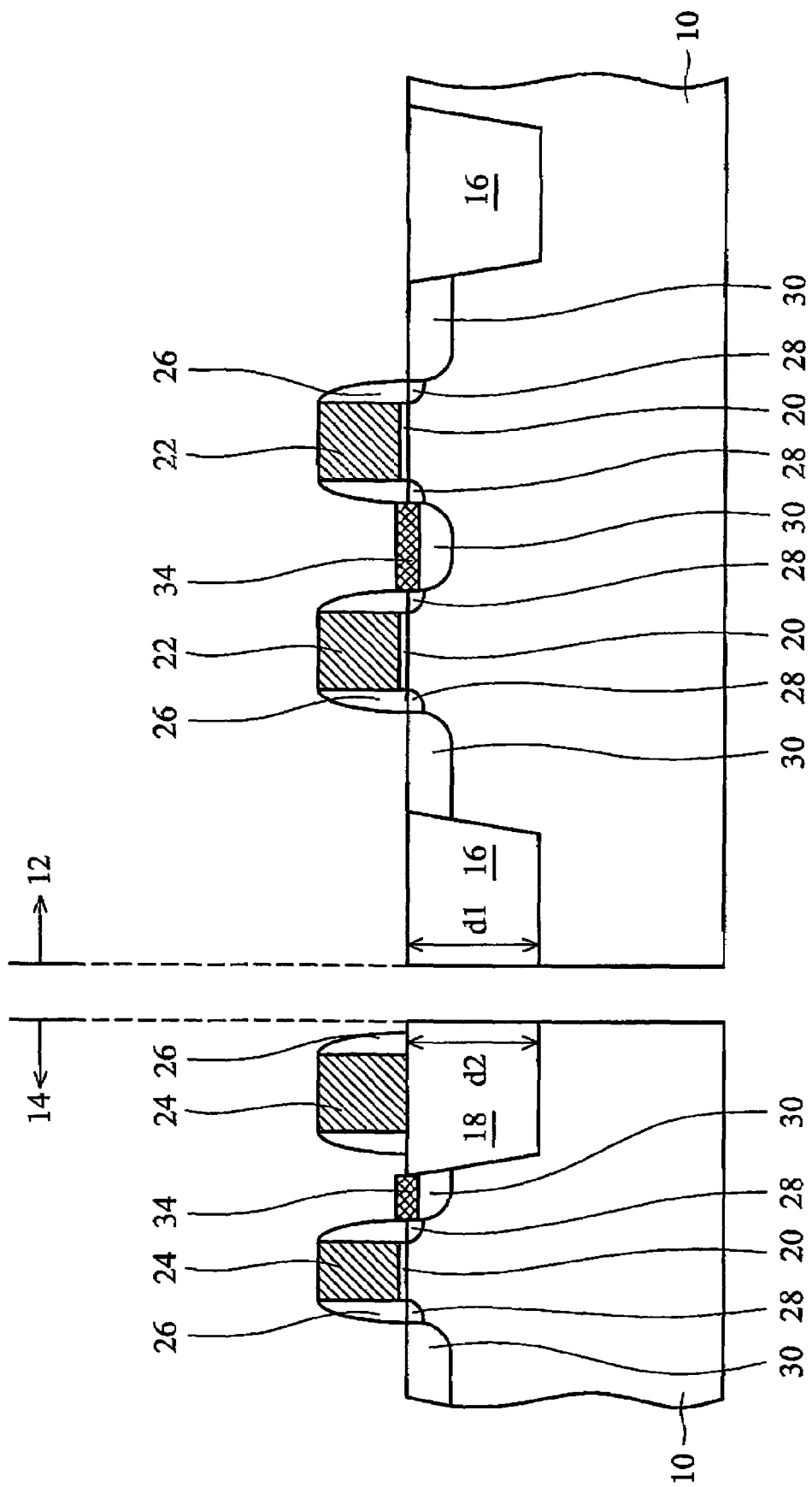
FIGS. 1-15 are pictorial diagrams illustrating an exemplary embodiment of a MIM capacitor process compatible with a metal gate process according to the present invention.

The present invention provides 1T-RAM technology compatible with a metal gate process, which overcomes the aforementioned problems of the prior art arising from the use of polysilicon gate electrodes. Particularly, the metal gate process is compatible with a MIM capacitor embedded isolation structure to fabricate a metal gate electrode formed of the same metal material as a top electrode during the same deposition and patterning procedures. The integrated process for the metal gate electrode and the MIM capacitor embedded isolation structure has wide applicability to many manufacturers, factories and industries, and is potentially suited to a wide range of semiconductor device applications, for example mixed-mode integrated circuits, radio frequency (RF) circuits, static random access memory (SRAM), and dynamic random access memory (DRAM) technologies.

Reference will now be made in detail to the present embodiments, examples of which are illustrated in the accompanying drawings. Wherever possible, the same reference numbers are used in the drawings and the description to refer to the same or like parts. In the drawings, the shape and thickness of an embodiment may be exaggerated for clarity and convenience. This description will be directed in particular to elements forming part of, or cooperating more directly with, an apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Herein, cross-sectional diagrams of FIGS. 1-6, 8 and 11-14 and three-dimensional diagrams of FIGS. 7, 9-10 and 15 illustrate an exemplary embodiment of a 1T-RAM technology compatible with a metal gate process according to the present invention.

In FIG. 1, a substrate 10 has a memory cell array region 12 and a peripheral circuit region 14, which are isolated by respective shallow trench isolation (STI) structures 16 and 18. In the context of this disclosure, the term "substrate" refers to any supporting structures, including, but not limited to, a semiconductor substrate, a semiconductor wafer, and any construction comprising semiconductor material layers. The memory cell array region 12 is for the use of a 1T-RAM cell, and the peripheral circuit region 14 is a logic region for the use of core circuits or I/O circuits. In one embodiment, the STI structure 16 on the memory cell array region 12 has a depth d1 approximately equal to a depth d2 of the STI structure 18 on the peripheral circuit region 14. The depth d1 may vary from about 2500 to about 4500 angstroms, and the depth d2 may vary from about 2500 to about 4500 angstroms. The STI structures 16 and 18 may be created with conventional approaches, including, but not limited to, steps of etching trenches into the substrate, depositing isolating materials (oxide, nitride or combinations thereof) into the trenches, polishing off the excess isolating materials, and planarizing the trenches for the next level of fabrication.

Dummy transistors are provided on the memory cell array region 12 and the peripheral circuit region 14 as described below. In one embodiment, dummy gate electrode layers 22 and 24 are formed on respective dummy gate dielectric layers 20 and integrated with processes for forming sidewall spacers 26, lightly doped drain (LDD) regions 28, source/drain regions 30, and metal silicide layers 34. The material used to form the dummy gate electrode layers 22 and 24 may include, for example polysilicon, metal, metal alloys, and other suitable conductive materials. Alternatively, masking materials typically used for dopant implantation alignment, such as SiN, SiON, SiC and the like may be used to form the dummy gate electrode layers 22 and 24. The dummy gate dielectric layer 20 may include silicon oxide, silicon nitride, silicon oxynitride, silicon carbide, or other suitable dielectrics. The sidewall spacer 26 may include, for example, silicon oxide, silicon nitride, silicon oxynitride, or a combination thereof. The metal silicide layer 34 may include WSi, CoSi, NiSi, or TiSi. Fabrication methods of the dummy transistors shown in FIG. 1 are conventionally well known and no further detailed discussion is necessary.

Figure 2:
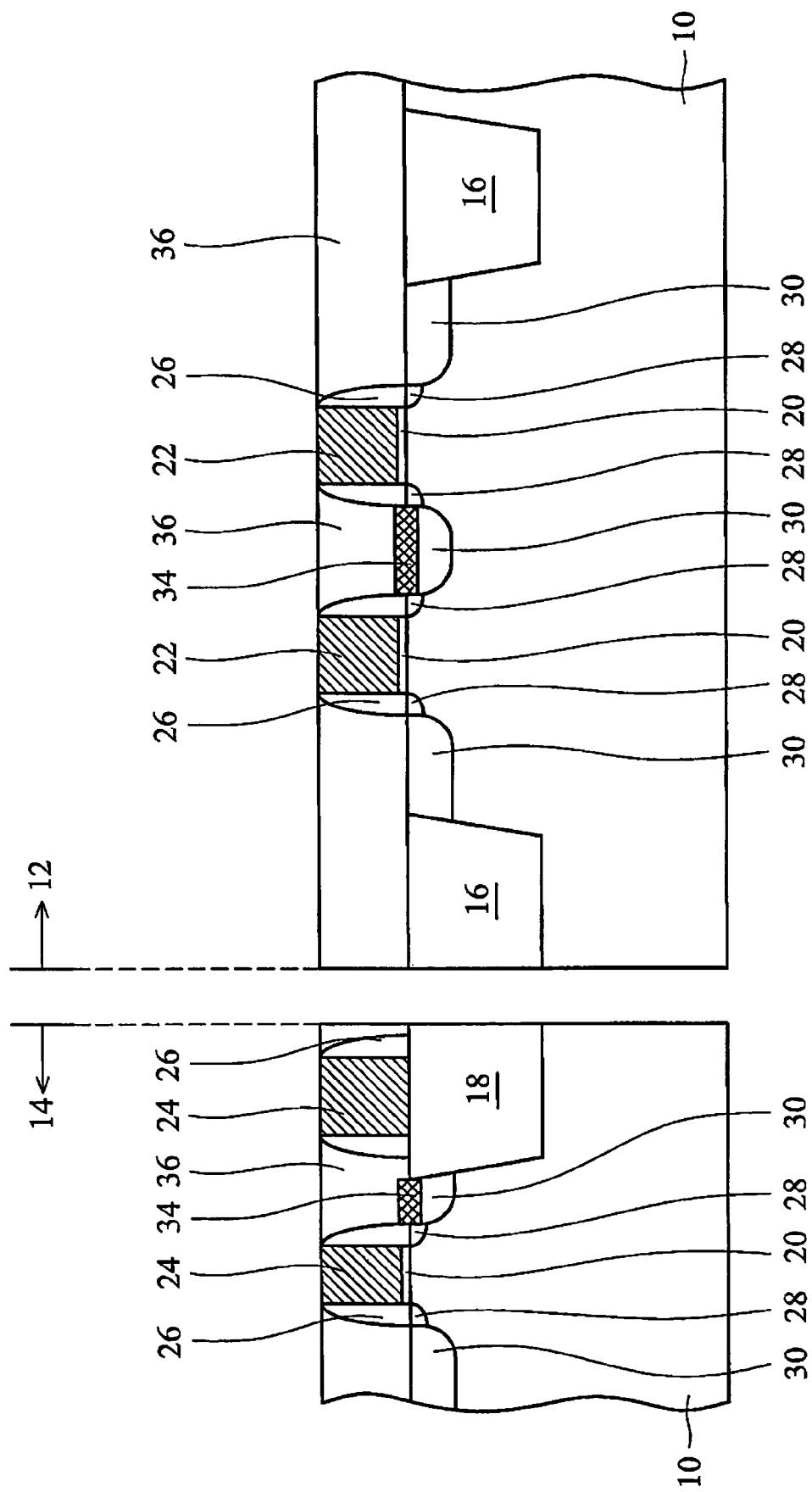

As shown in FIG. 2, a first dielectric layer 36 is deposited on the substrate 10 to fill the space between adjacent dummy transistors through any of a variety of techniques, including LPCVD (low-pressure chemical vapor deposition), APCVD (atmospheric-pressure chemical vapor deposition), PECVD (plasma-enhanced chemical vapor deposition), spin-on coating, and future-developed deposition procedures. The material used to form the first dielectric layer 36 may include, for example, silicon oxide, silicon nitride, silicon oxynitride, low-k dielectric materials, other isolating materials, or combinations thereof. Next, an anisotropic etching process, i.e., an etch back process, or a planarization technology, i.e., CMP (chemical mechanical polish) process, may be employed to remove the excess portion of the first dielectric layer 36 until the first dielectric layer 36 is leveled off with the dummy gate electrode layers 22 and 24.

Figure 3:
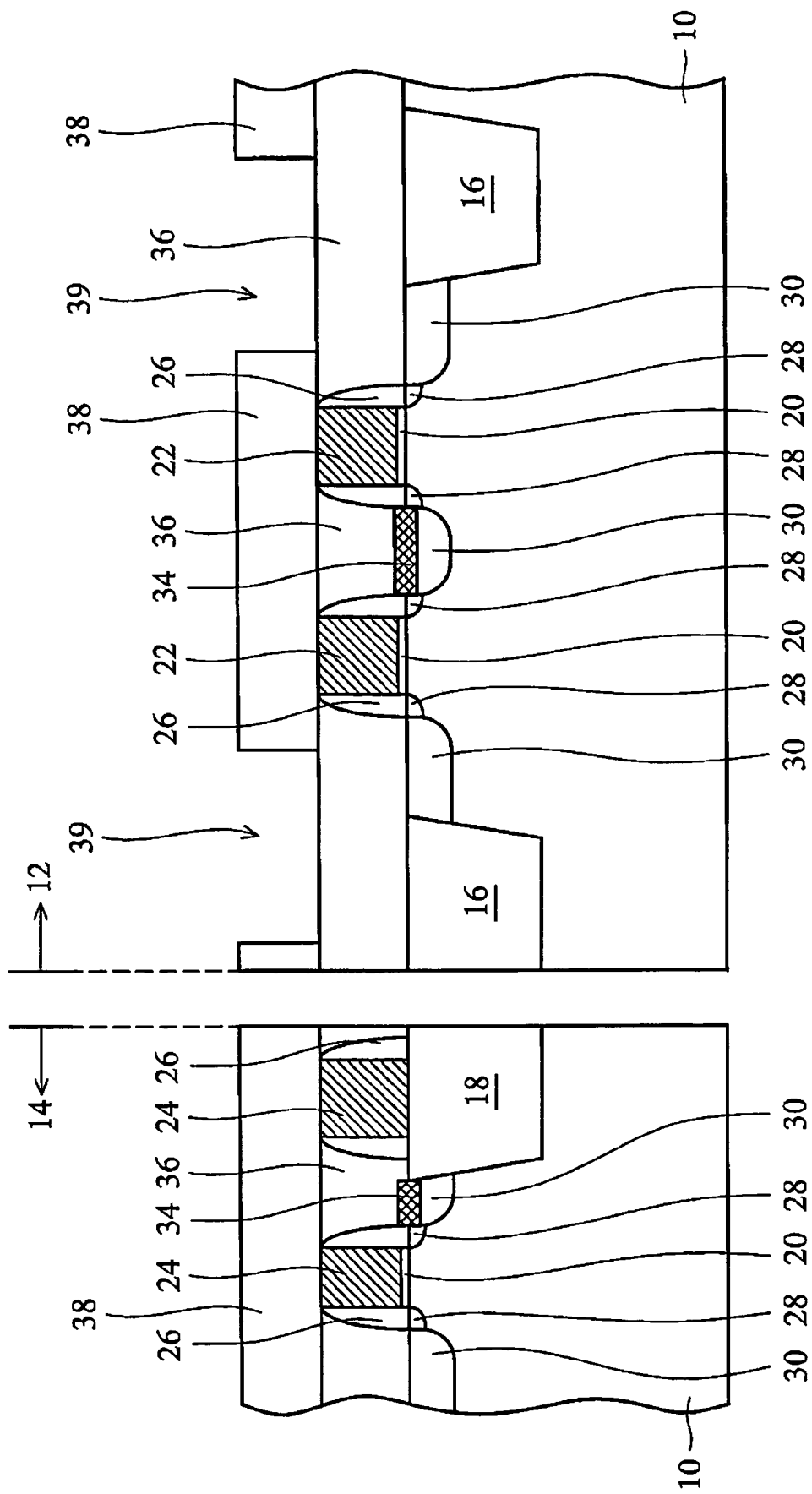
Figure 4:
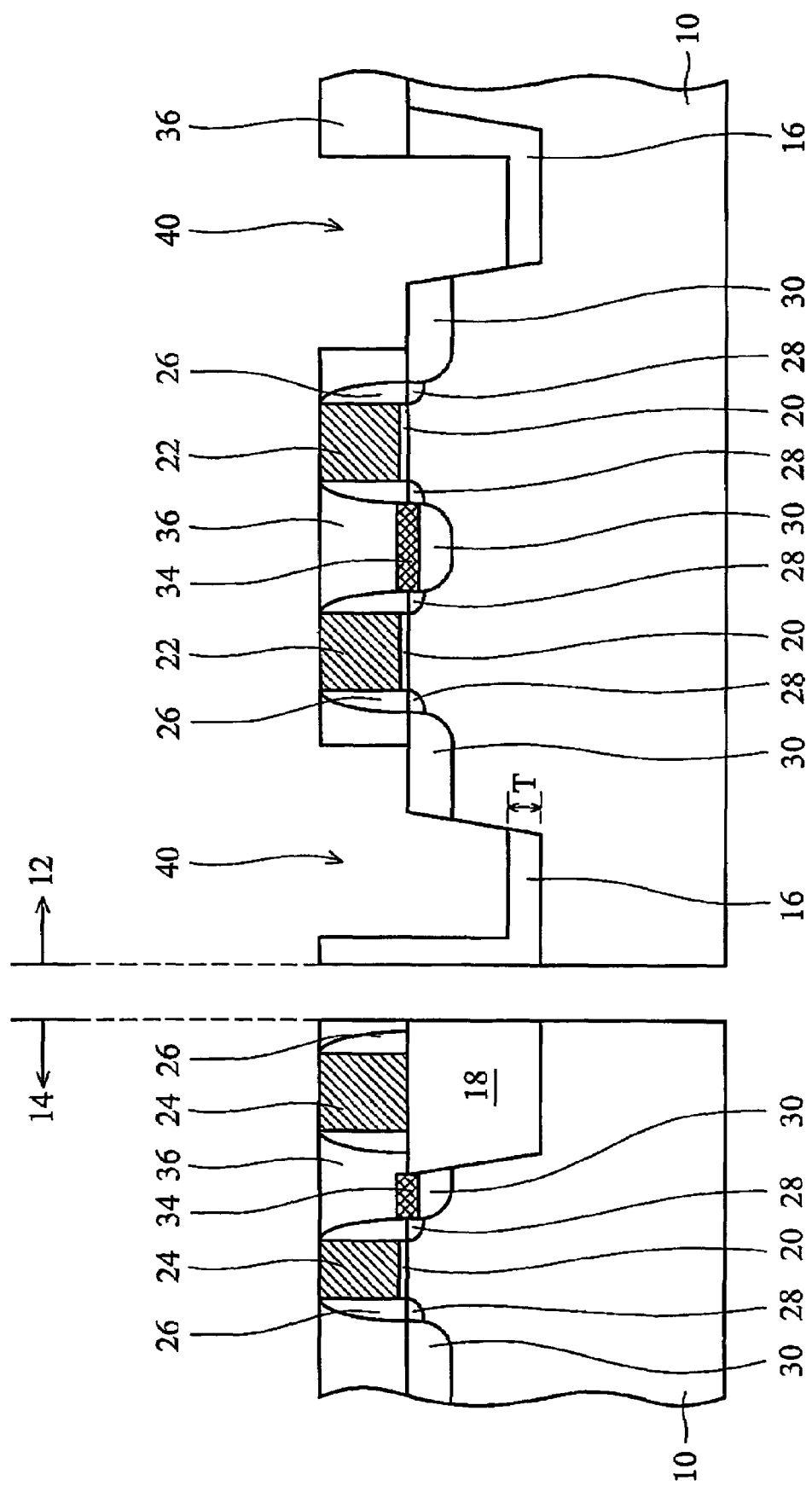

Through lithography, masking and dry etching techniques, capacitor trenches are then etched into the STI structures 16 of the memory cell array region 12 as set forth in FIGS. 3 and 4. A first photoresist layer 38 is provided on the first dielectric layer 36 to fully cover the peripheral circuit region 14, but only partially cover the memory cell array region 12. In detail, the first photoresist layer 38 has first openings 39 for defining respective capacitor trench patterns on the memory cell array region 12. Then, dry etch processes such as RIE (Reactive Ion Etching) and other plasma etching processes may be performed to form capacitor trenches 40 as shown in FIG. 4. Portions of the first dielectric layer 36 and STI structures 16 exposed under the first openings 39 are removed until the bottom thickness T of the respective STI structures 16 reaches from about 500 angstroms to about 3000 angstroms. The first photoresist layer 38 is then stripped off from the first dielectric layer 36. Thus, the capacitor trench 40 exposes portions of the STI structure 16 and the substrate 10 adjacent to the source/drain regions 30. The opening diameter of the capacitor trench 40 is a matter of design choice dependent on product requirements and process limitations.

Figure 5:
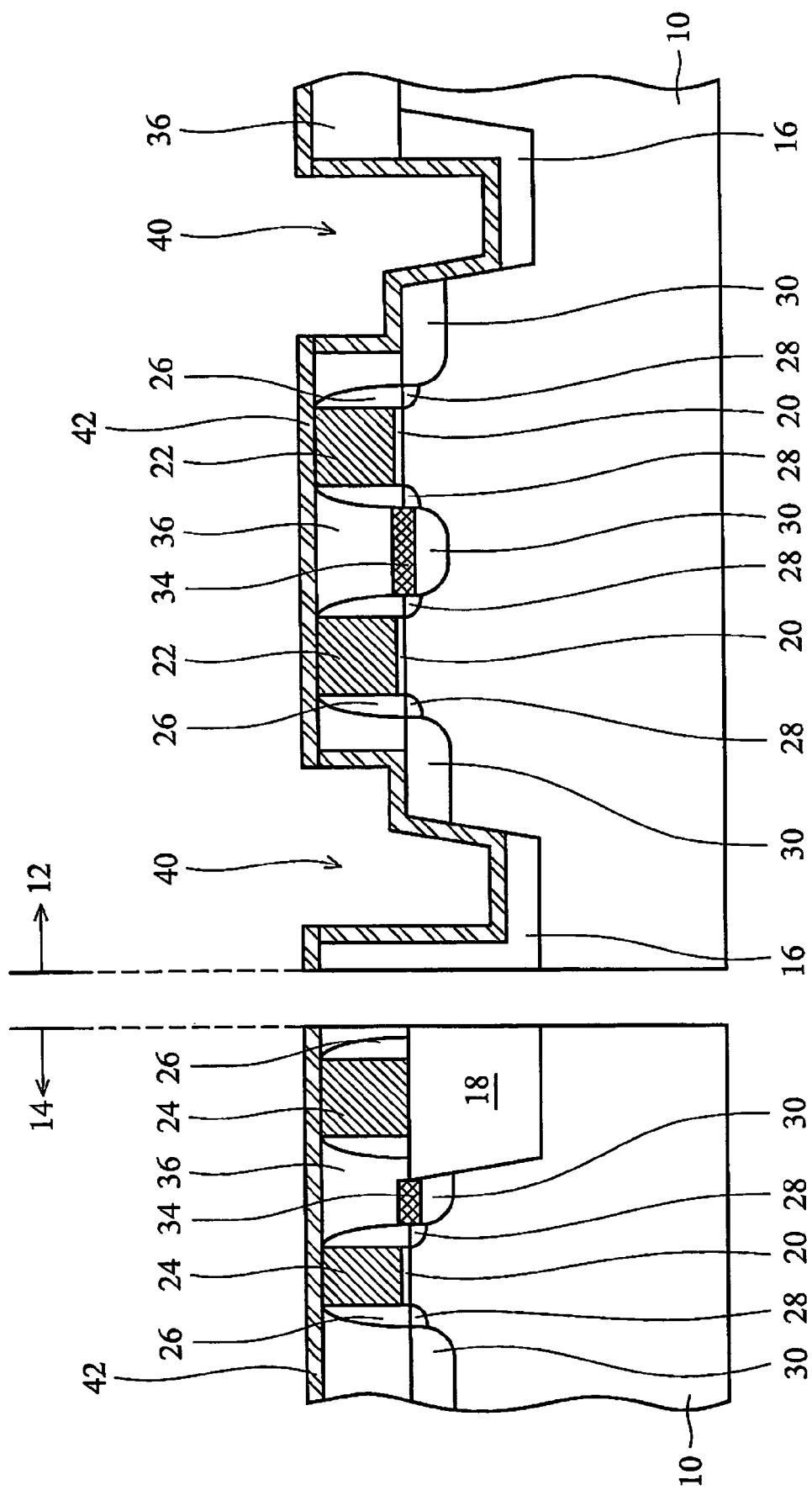
Figure 6:
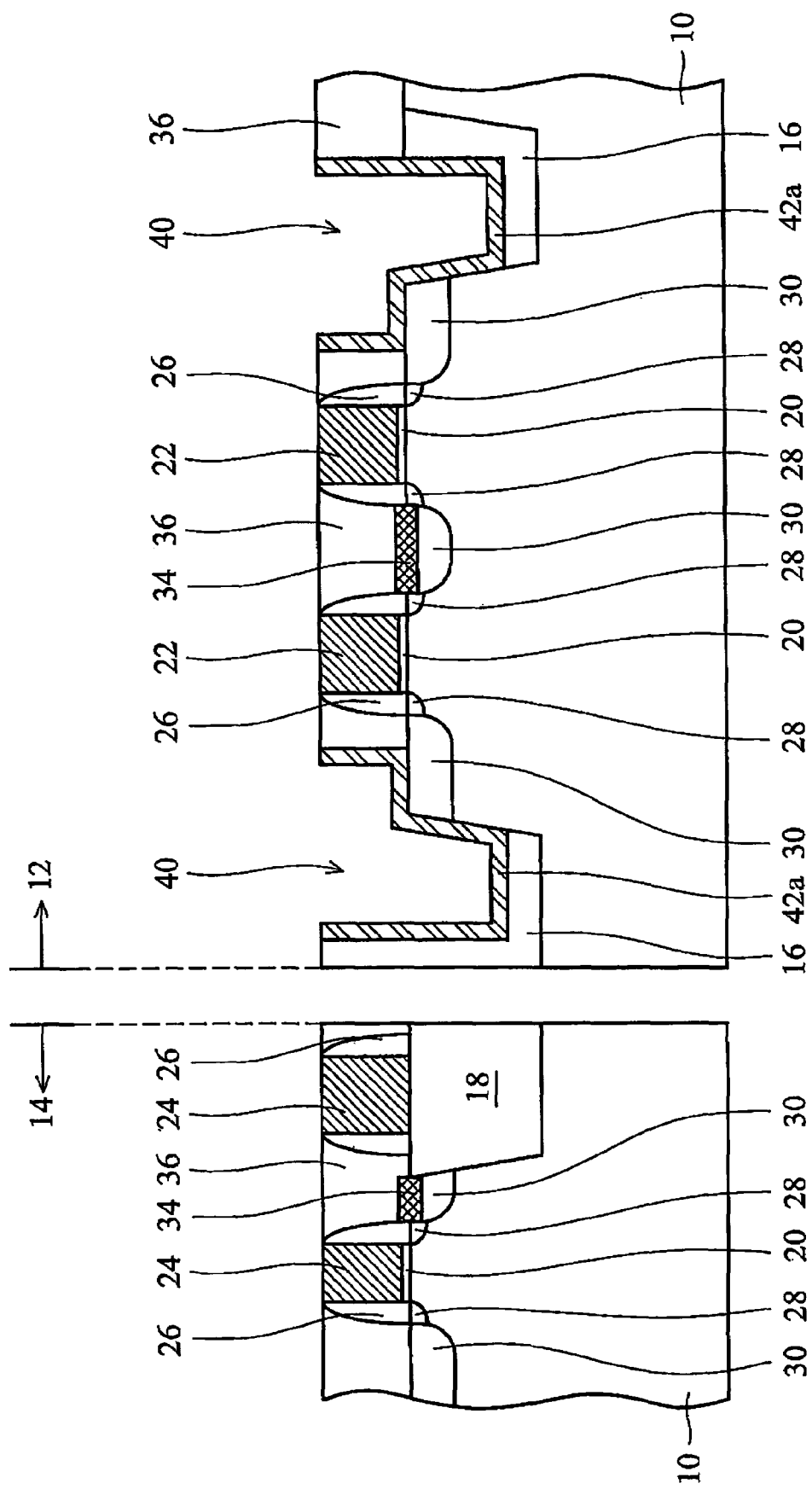
Figure 7:
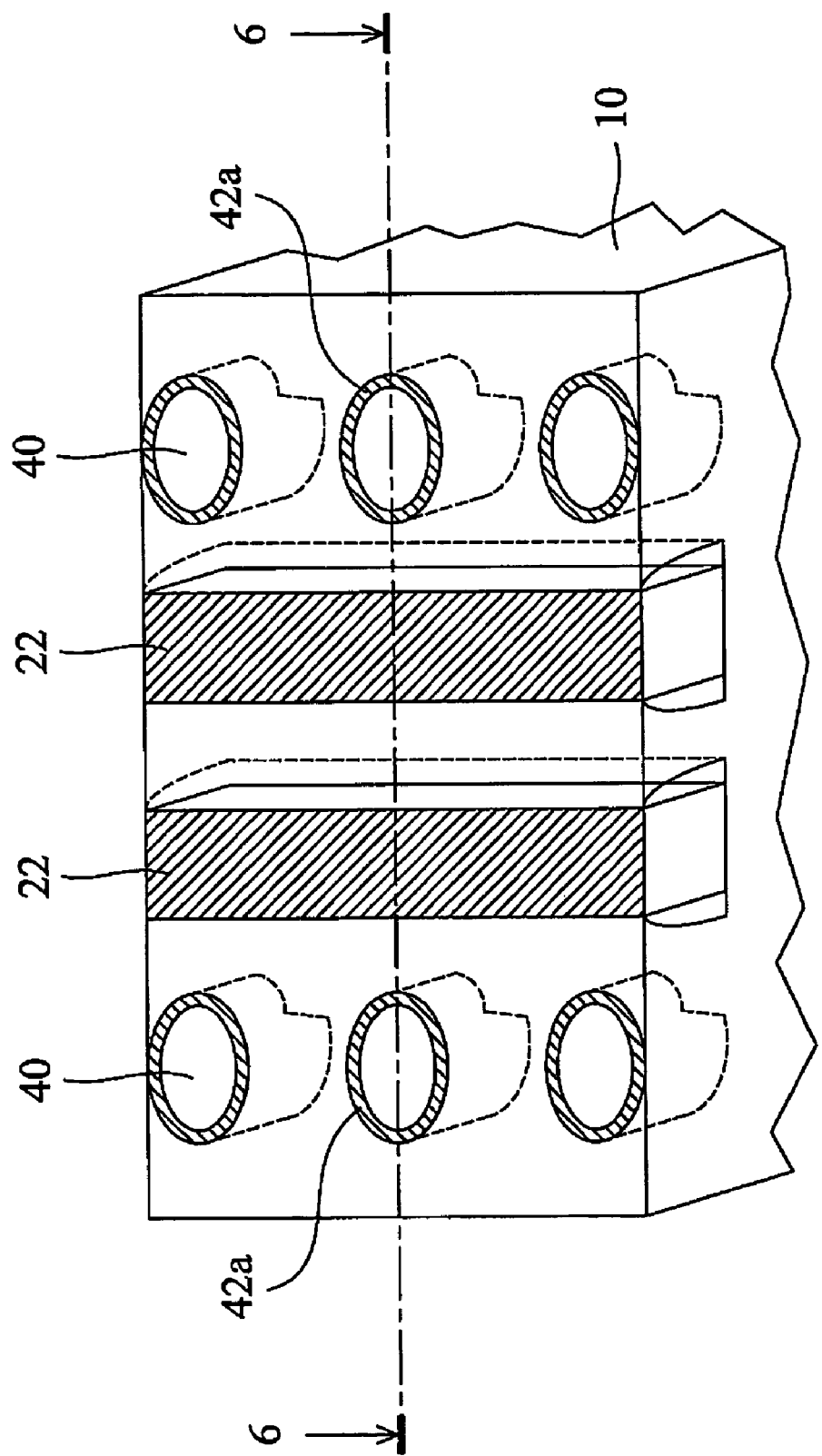

Through metal deposition and etch back techniques, a bottom electrode 42a is formed along the bottom and sidewall of the capacitor trench 40 as shown in FIGS. 5 and 6. Referring to FIG. 5, a first metal layer 42 is conformally formed on the substrate 10 by a blanket deposition. The first metal layer 42 may include a single-metal layer, a dual-metal stack or a multi-layered stack, selected from W, WN, Ti, TiW, TiN, Ta, TaN, Al, Cu, Mo, or the like. The blanket deposition for the first metal layer 42 may include, but is not limited to, CVD, PVD (physical vapor deposition), evaporation, plating, ALD (atomic layer deposition), or combinations thereof. The deposition conditions allow for continuous coverage of the first metal layer 42 over the sidewall of the capacitor trench 40 without affecting its electrical characteristics during and after its deposition. The thickness of the first metal layer 42 may vary from about 50 angstroms to about 500 angstroms. Referring to FIG. 6, the first metal layer 42 outside the capacitor trenches 40 is then removed by CMP or etch back technologies, thus the first metal layer 42 remaining along the sidewall and bottom of the capacitor trench 40 serves as a bottom electrode 42a. FIG. 7 is a three-dimensional diagram illustrating an exemplary array of the bottom electrodes 42a formed in respective capacitor trenches 40, and FIG. 6 is a cross-sectional view along line 6-6 of FIG. 7.

Figure 8:
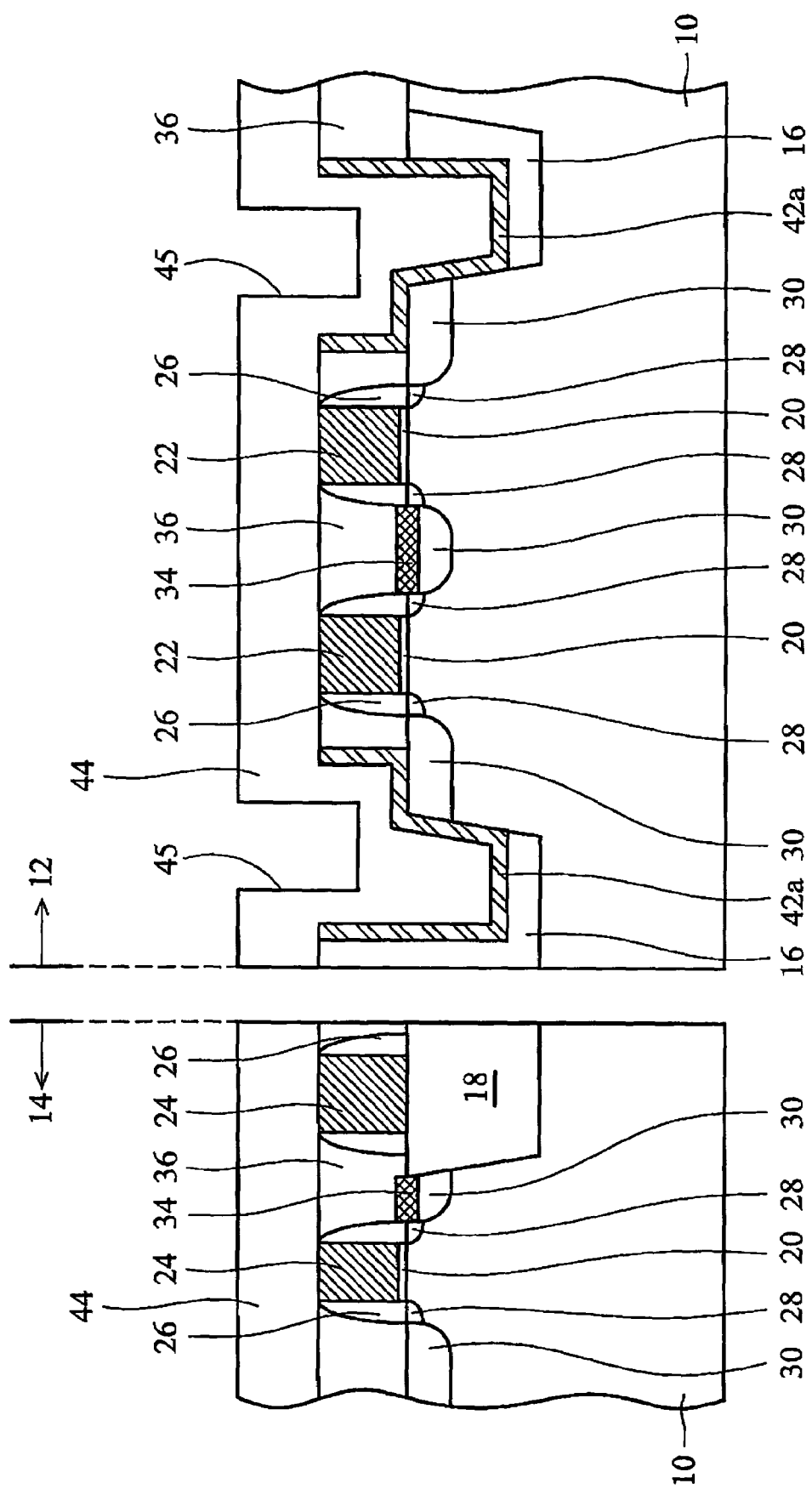
Figure 9:
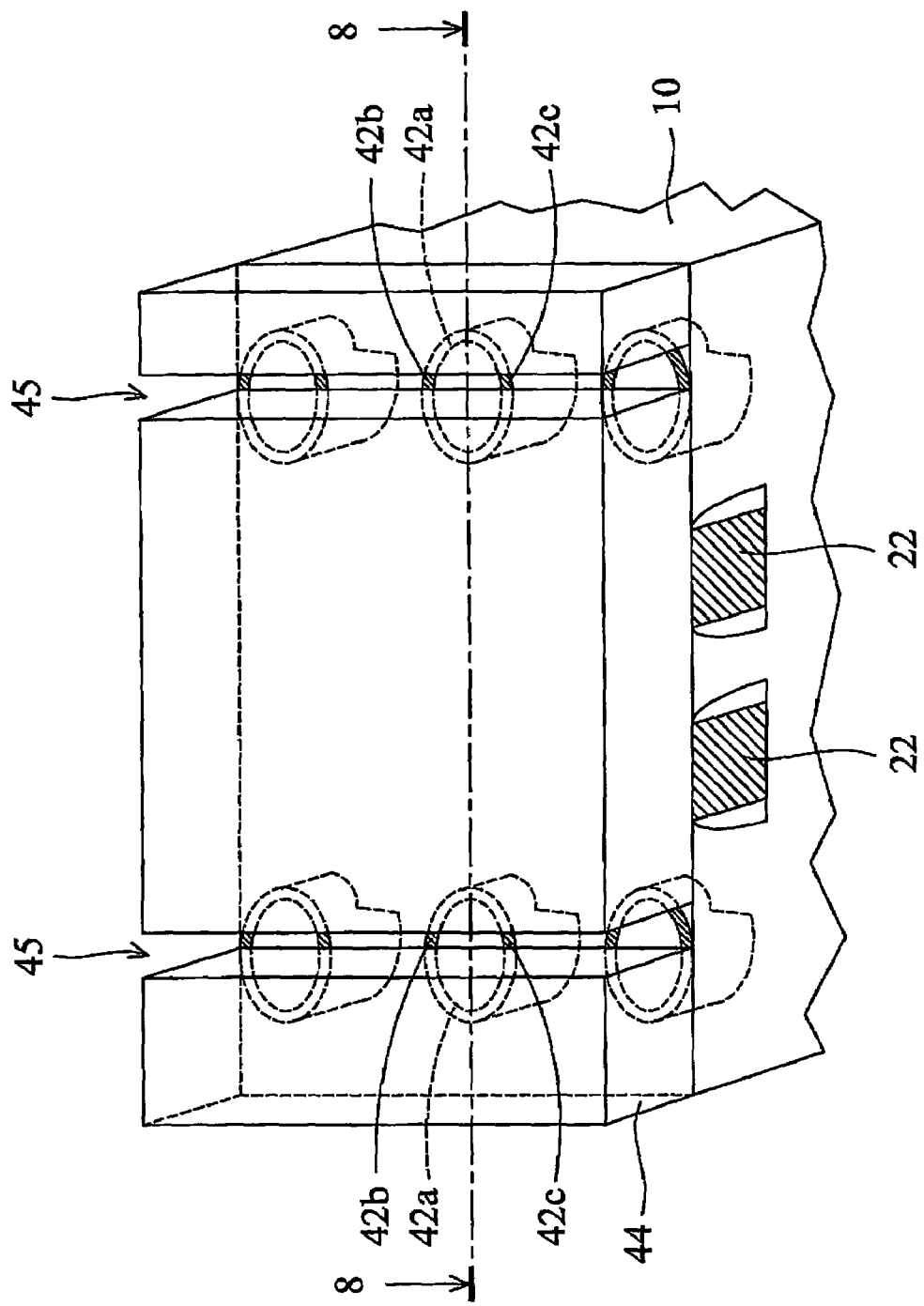
Figure 10:
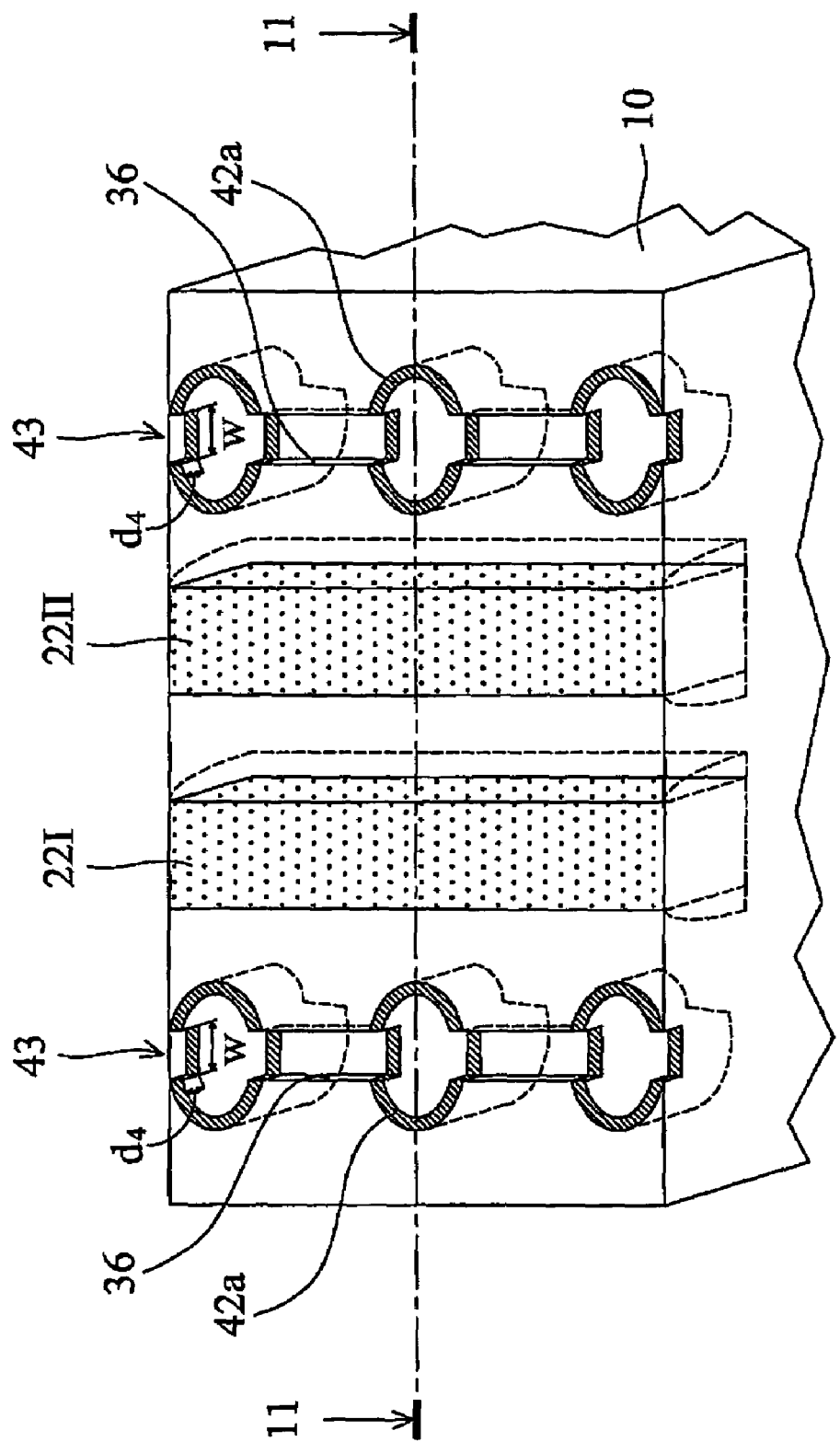
Figure 11:
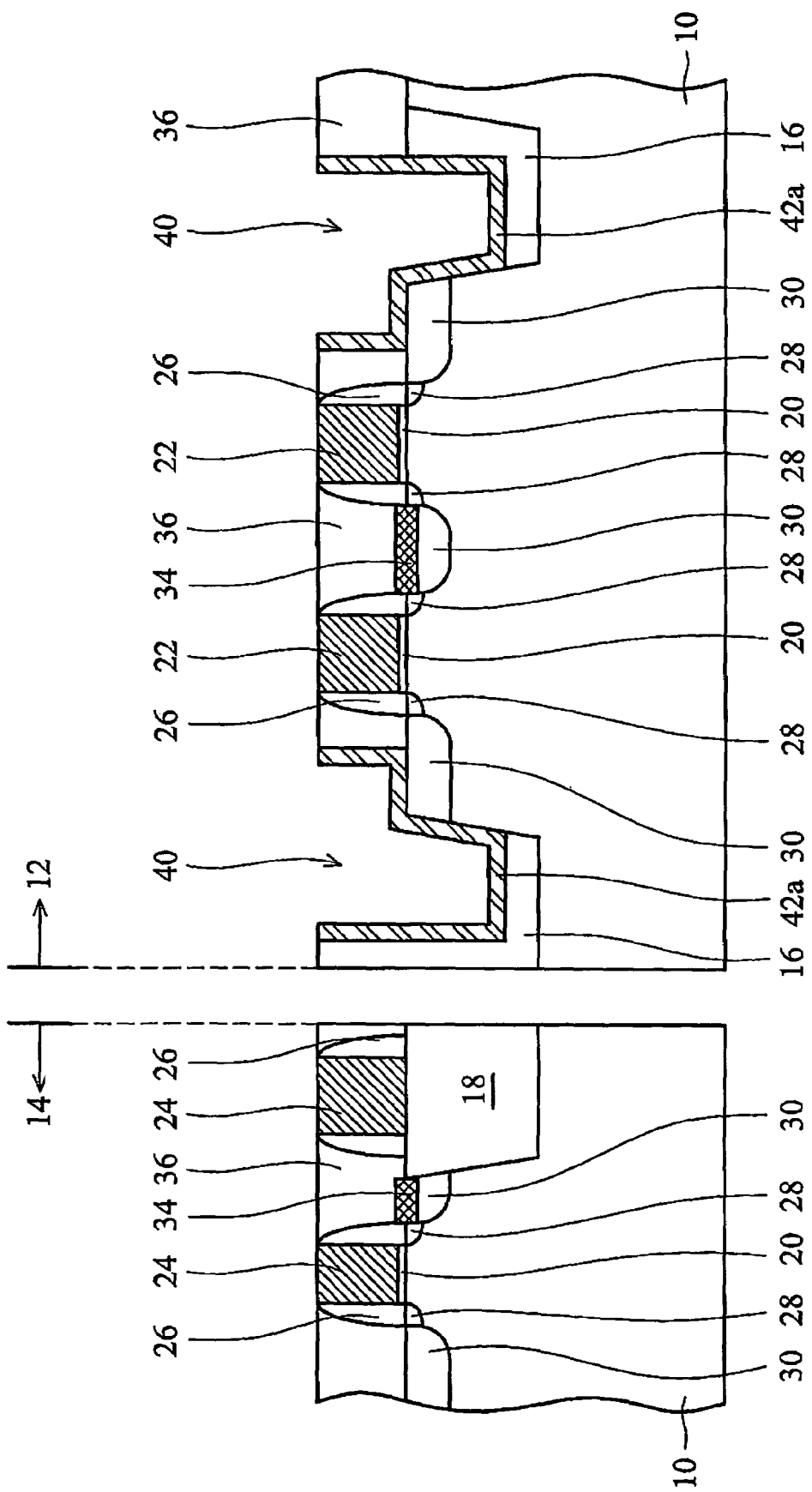
Figure 12:
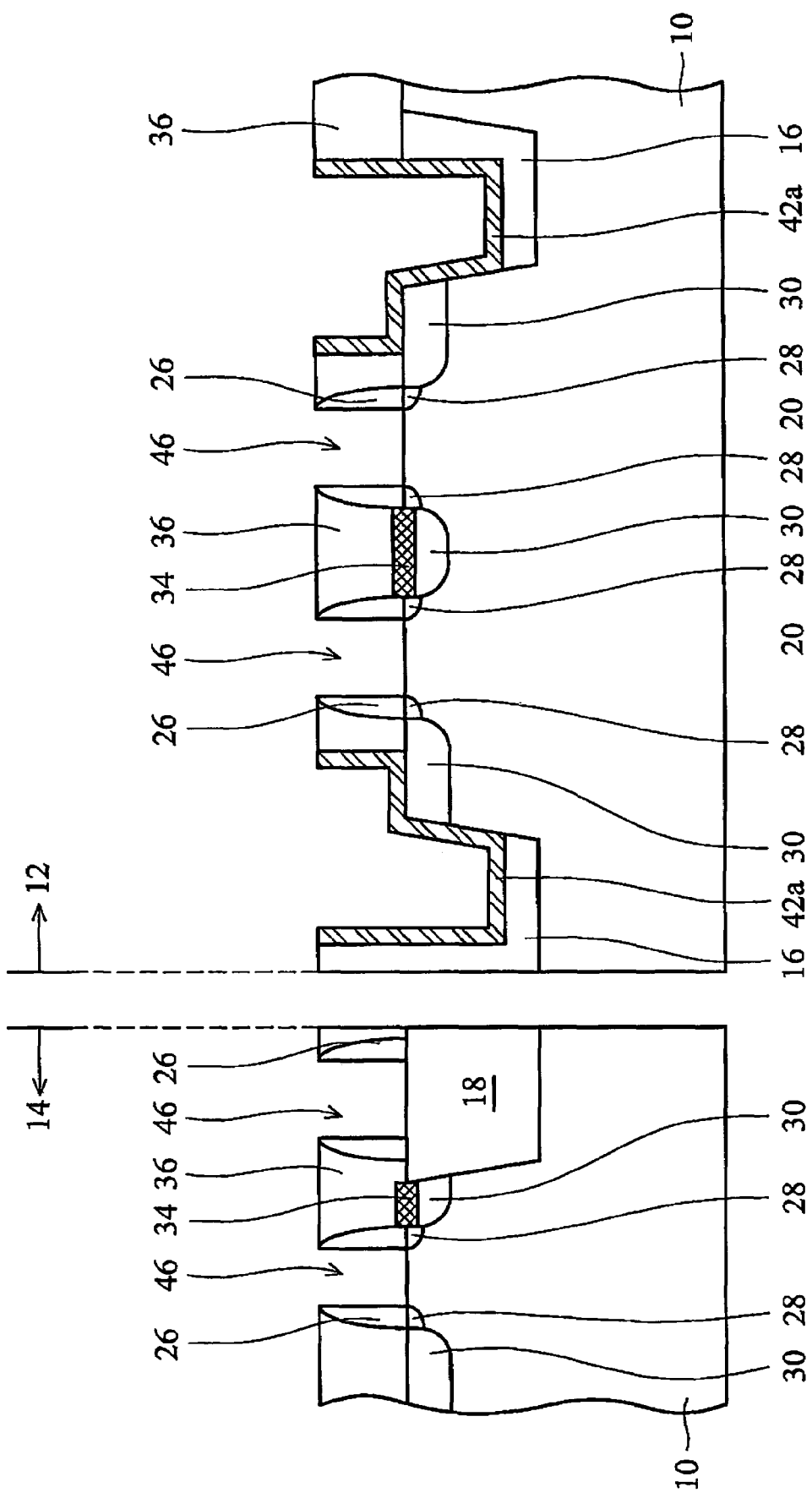

After patterning the bottom electrodes 42a, a microtrench process for a connection path between adjacent capacitors is now described in FIGS. 8-11. FIG. 8 is a cross-sectional diagram along line 8-8 of FIG. 9, and FIG. 11 is a cross-sectional diagram along line 11-11 of FIG. 10.

Referring to FIGS. 8 and 9, a second photoresist layer 44 is formed on the substrate 10 to provide a second opening 45 for defining at least one micro-trench pattern on the memory cell array region 12. In one embodiment, each bottom electrode 42a comprises two non-continuous portions 42b and 42c, and the second opening 45 exposes the portions 42b and 42c and the first dielectric layer 36 there between, thus defining a connection path between adjacent capacitors. The profile and size of the second opening 45 are design choices dependent on electrical connection paths among MIM capacitors. The second opening 45 may include, but is not limited to, for example, stripe-shaped openings, curve-shaped openings, sawtooth-shaped openings, or other geometric openings arranged in parallel, in perpendicular, in an uncrossed format, or in an intersected format. In an exemplary embodiment as shown in FIG. 9, the second opening 45 comprises stripe-shaped openings, and each stripe-shaped opening crosses a plurality of capacitor trenches 40 substantially aligned in a direction along the dummy gate electrode layer 22. Next, in FIG. 10, dry etch processes, such as RIE and other plasma etching processes, allow production of micro-trench patterns 43 that are etched into the non-continuous portions 42b and 42c and the first dielectric layer 36 there between to reach a predetermined depth d4 and a predetermined width w. The second photoresist layer 44 is then stripped from the substrate 10, and thereby the bottom electrodes 42a and the capacitor trenches 40 are exposed again as shown in FIG. 11. The depth d4 may vary from about 0.05 angstroms to 0.3 angstroms, and the width w may vary from about 100 angstroms to 1500 angstroms. Depending on product requests and process limitations, the profile, size and amount of the micro-trench patterns 43 are design choices. The purpose of fabricating the micro-trench patterns 43 is to create a connection trench across upper portions of adjacent top electrodes being fabricated in subsequent processes.

Before proceeding with forming capacitor dielectrics and top electrodes of the MIM capacitors, the dummy gate electrode layers 22 and 24 and the dummy gate dielectric layers 20 are successively removed from the memory cell array region 12 and the peripheral circuit region 14 through lithography, masking, dry etch or other selective etching processes dependent on the materials used for the layers 22, 24 and 20. As a result, in FIG. 12, third openings 46 surrounded by the sidewall spacers 26 and the first dielectric layer 36 are formed to expose the substrate 10. The third openings 46 define areas for self-aligned metal gate electrodes on the memory cell array region 12 and the peripheral circuit region 14.

Figure 13:
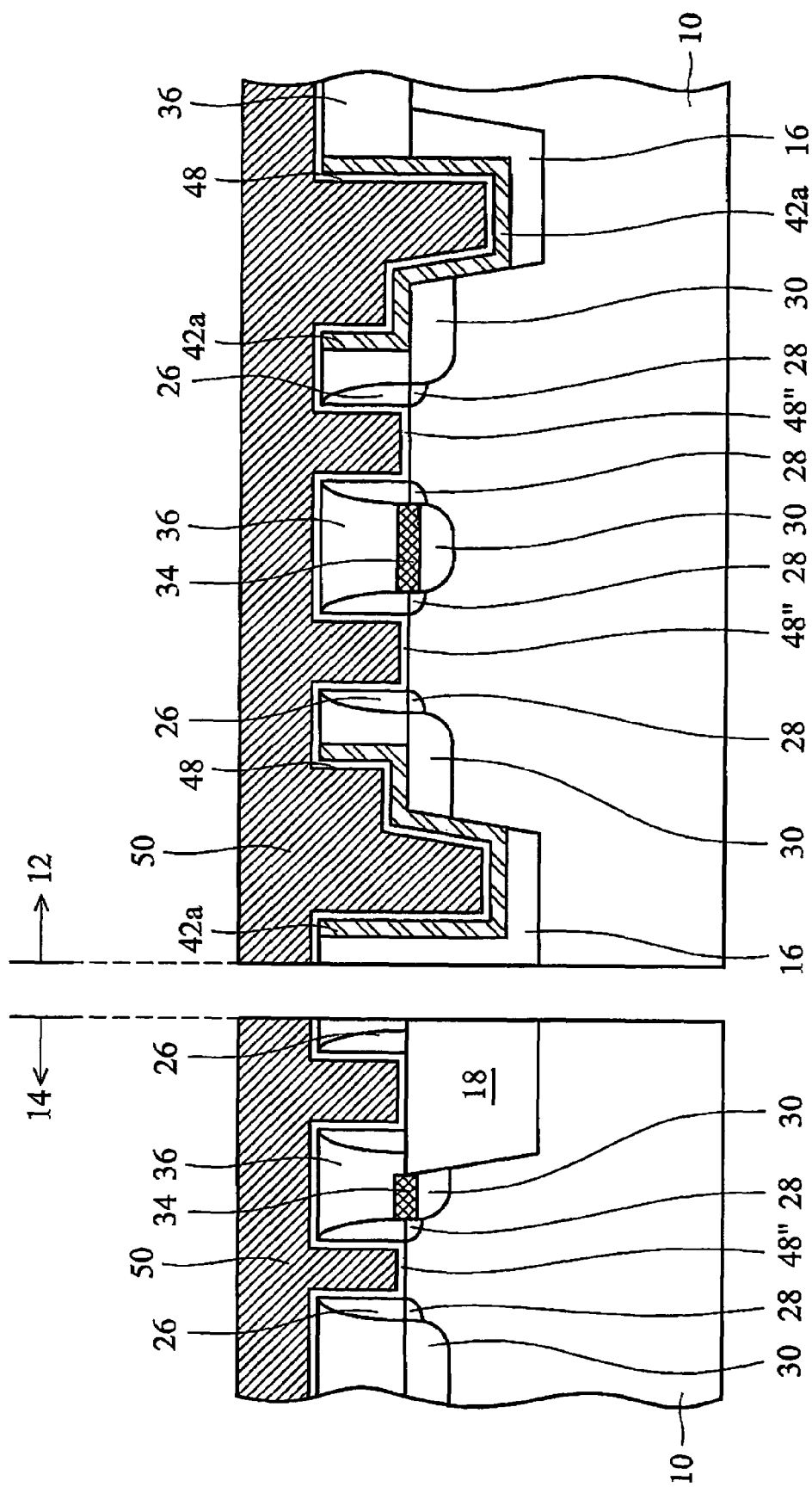
Figure 14:
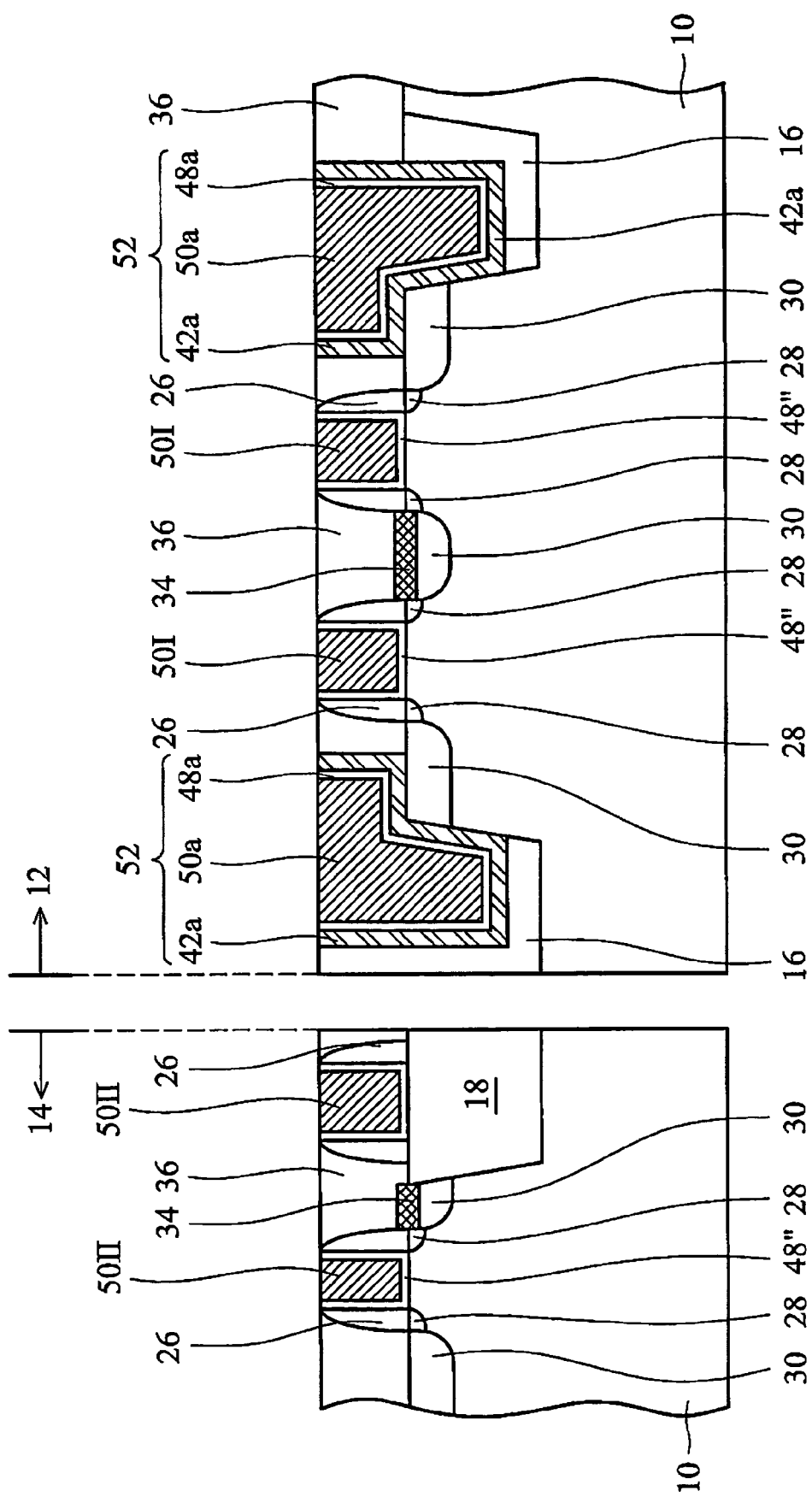
Figure 15:
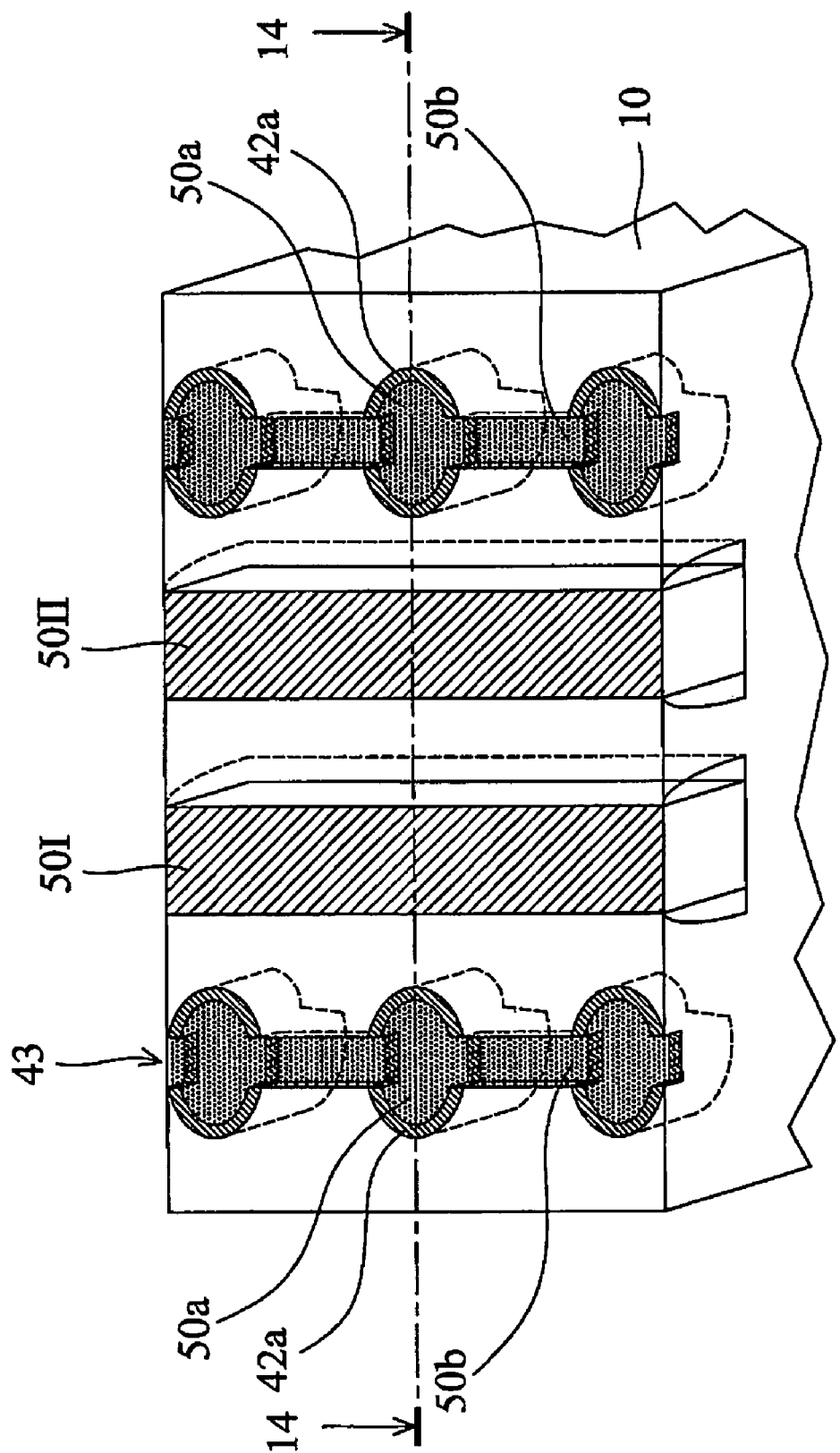

The MIM capacitor process for capacitor dielectrics and top electrodes now proceeds in FIGS. 13-15. In FIG. 13, a second dielectric layer 48 is conformally deposited on the substrate 10 through any of a variety of deposition techniques, including CVD, LPCVD, APCVD, PECVD, ALD and the like. Particularly, the second dielectric layer 48 covers the bottom electrodes 42a, the micro-trench patterns 43 and the third openings 46. The material used to form the second dielectric layer 48 may include a high-k material. The term "high-k" as used herein denotes a dielectric that has a dielectric constant (k) of greater than about 4.0, preferably from about 8 to about 50. It is noted that all the dielectric constants disclosed herein are relative to a vacuum, unless otherwise stated. A wide variety of high-k dielectrics may be employed, including but not limited to: binary metal oxides such as $Ta_2O_5$, $HfO_2$, $Al_2O_3$, $InO_2$, $La_2O_3$, $ZrO_2$ and $TaO_2$; silicates, aluminates and oxynitrides of said binary metal oxides; and perovskite-type oxides. Combinations and/or multilayers of such high-k dielectrics are also contemplated herein. The second dielectric layer 48 preferably has a thickness of from about 10 to about 250 angstroms. In a preferred embodiment, the second dielectric layer 48 is a $Ta_2O_5$ layer.

Successively, a second metal layer 50 is formed on the second dielectric layer 48 to fill the fourth openings 46, the capacitor trenches 40 and the micro-trench patterns 43. The second metal layer 50 may be a single-metal layer, a dual-metal structure or a multi-layered structure selected from at least one of W, WNx, Ti, TiWx, TiNx, Ta, TaNx, Mo, Al, Cu, and the like. The suffix "x" can be modified to adjust the work function of the gate electrode. Any of a variety of deposition techniques, including, but not limited to, CVD, PVD, evaporation, plating, sputtering, reactive co-sputtering or combinations thereof, may allow the production of the second metal layer 50. In a preferred embodiment, the second metal layer 50 is a TiN/W/Cu multi-layered structure. In another preferred embodiment, the second metal layer 50 is a TiN/W dual-layered structure.

In FIG. 14, an etch back or a CMP process may be performed to remove portions of the second metal layer 50 and the second dielectric layer 48 until the top of the first dielectric layer 36 is exposed and leveled off with the second metal layer 50. As a result, a portion 50a of the second metal layer 50 remaining in the capacitor trench 40 serves as a top electrode 50a, and a portion 48a of the second dielectric layer 48 sandwiched between the bottom electrode 42a and the top electrode 50a serves as a capacitor dielectric 48a, thus MIM capacitors 52 are completed in the respective STI structures 16, referring to a MIM capacitor embedded isolation structure. Also, portions 50I and 50II of the second metal layer 50 remaining in the third openings 46 serve as self-aligned metal gate electrodes 50I and 50II, respectively. The portions 48" of the second dielectric layer 48 surrounding the bottom and sidewalls of the metal gate electrodes 50I and 50II serve as gate dielectrics thereof, respectively. The metal gate electrodes 50I and 50II integrated with the high-k gate dielectrics 48" are therefore completed on the memory cell array region 12 and the peripheral circuit region 14. In addition, a portion 50b remaining in the micro-trench patterns 43 serves as a connection pad 50b which can couple upper portions of adjacent top electrodes 50a together as shown in FIG. 15.

FIG. 15 is a three-dimensional diagram illustrating a connection path among the top electrodes 50a of adjacent MIM capacitors 52. Capacitor dielectrics 48a are omitted in FIG. 15 for clarity. FIG. 14 is a cross-sectional diagram along line 14-14 of FIG. 15. For example, the top electrodes 50a of the MIM capacitors 52 aligned in a line can be connected through the connection pads 50b. The connection pads 50b may be leveled off with the top electrodes 50a and the metal gate electrodes 50I and 50II.

Accordingly, a fabrication method for 1T-RAM technology has been presented that allows for a metal gate electrode formed of the same metal material as a top electrode of a MIM capacitor, and allows for a gate dielectric layer formed of the same high-k dielectric material as a capacitor dielectric. Thus, the MIM capacitor process can be fully compatible with the metal gate process to offer process cost competitiveness. Also, the fabrication method creates connection pads in micro-trench patterns across adjacent MIM capacitors, thus corresponding top electrodes can be electrically connected to each other. Moreover, the metal gate electrodes formed on the memory cell array region and the logic peripheral region have advantages of their pattern ability, low sheet resistance, good thermal reliability, excellent current flow, less voltage depletion problems than polysilicon, and scalability to advanced MOS technologies.

Embodiments of the present invention provide the MIM capacitor, which has a lower portion embedded in the STI structure and has an upper portion substantially leveled off with the metal gate electrode. The trench design for the MIM capacitor allows the formation of densely arranged memory cell arrays. The capacitance may be increased by providing a capacitor dielectric with a high permittivity, forming a capacitor dielectric of a large surface area, or using a thin capacitor dielectric. In an exemplary implementation of the present invention, one approach for improved capacitance is to provide a capacitor dielectric with a large surface area by increasing the depth of the capacitor trench. For example, the depth d1 of the STI structure 16 may be increased, and thereby capacitor trench 40 may extend to a deeper location.

Figure 16:
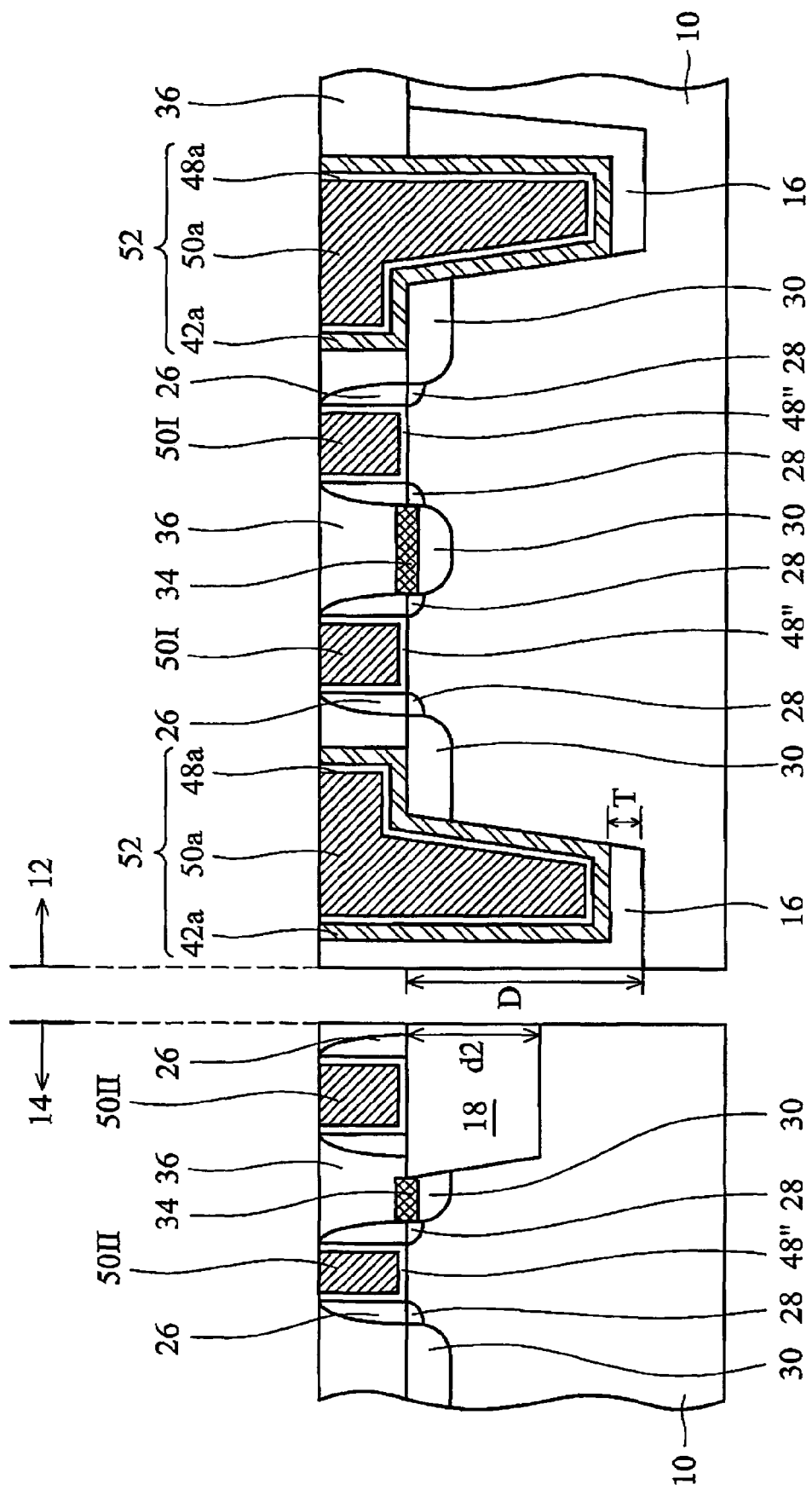
FIG. 16 is a pictorial diagram illustrating an embodiment of a dual-STI design in the 1T-RAM technology according to the present invention.

FIG. 16 is a cross-sectional diagram illustrating an example of dual-STI design in the 1T-RAM technology compatible with the metal gate process, while explanation of the same or similar portions to the description in FIGS. 1-15 will be omitted. Compared with the STI structure 18 fabricated on the peripheral circuit region 14, a STI structure 16" having a greater depth is created on the memory cell array region 12. For example, the STI structure 16" has a depth D greater than the depth d2 of the STI structure 18. The depth D may vary from about 5000 to about 9000 angstroms, and the bottom thickness T of the STI structure 16" reaches from about 500 angstroms to about 3000 angstroms. Thus, the capacitor dielectric 48a has an increased surface area to contribute improved capacitance to the MIM capacitor 52.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A fabrication method of forming a semiconductor device, comprising:
   providing a substrate having a first region and a second region;
   forming a first dielectric layer overlying said substrate;
   forming a first trench and a second trench passing through said first dielectric layer and a portion of said substrate on said first region;
   forming a first trench isolation structure and a second trench isolation structure in said substrate on said first region, wherein said first trench passes through said first dielectric layer and a portion of said first trench isolation structure, and wherein said second trench passes through said first dielectric layer and a portion of said second trench isolation structure;
   forming a first metal layer along the sidewall and bottom of said first trench and said second trench respectively;
   forming at least one opening passing through said first dielectric layer to expose said substrate on said second region;
   forming a second dielectric layer overlying said first metal layer and the sidewall and bottom of said opening; and
   forming a second metal layer overlying said second dielectric layer to fill said first trench, said second french and said opening.

2. The fabrication method of claim 1, wherein said second dielectric layer has a dielectric constant of greater than 4.0.

3. The fabrication method of claim 1, wherein said second dielectric layer comprises a metal oxide layer.

4. The fabrication method of claim 1, further comprising:
   forming at least one connection trench in said first metal layer and said first dielectric layer to cross an upper portion of said first trench and an upper portion of said second trench;
   wherein, the step of forming said second metal layer fills said connection trench with said second metal layer.

5. The fabrication method of claim 1, further comprising:
   planarizing said second metal layer until said second metal layer remaining in said first trench and said second trench is leveled off with said second metal layer remaining in said opening.

6. A fabrication method of a self-aligned metal gate electrode, comprising:
   providing a substrate comprising a first trench isolation structure and a second trench isolation structure;
   forming at least one transistor overlying said substrate outside said first trench isolation structure and said second trench isolation structure, wherein said transistor comprises a dummy gate dielectric layer and a dummy gate electrode layer formed overlying said dummy gate dielectric layer;
   forming a first dielectric layer overlying said substrate to cover said first trench isolation structure and said second trench isolation structure and surround said transistor;
   forming a first trench and a second trench passing through said first dielectric layer to reach a portion of said first trench isolation structure and a portion of said second trench isolation structure;
   forming a first metal layer on the sidewall and bottom of said first trench and said second trench respectively;
   removing said dummy gate electrode layer and said dummy gate dielectric layer to farm an opening in said first dielectric layer;
   forming a second dielectric layer overlying said substrate to cover said first metal layer and the sidewall and bottom of said opening;
   forming a second metal layer overlying said second dielectric layer to fill said first trench, said second french and said opening; and
   removing portions of said second metal layer and said second dielectric layer until said second metal layer remaining in said first trench and said second trench is leveled off with said second metal layer remaining in said opening;
   wherein, said second metal layer remaining in said opening serves as a self-aligned gate electrode.

7. The fabrication method of claim 6, wherein said second dielectric layer comprises a dielectric constant of greater than 4.0.

8. The fabrication method of claim 6, wherein said second dielectric layer comprises a metal oxide layer.

9. The fabrication method of claim 6, further comprising:
   forming at least one connection trench in said first metal layer and said first dielectric layer to cross an upper portion of said first trench and an upper portion of said second trench;
   wherein, the step of forming said second metal layer fills said connection trench with said second metal layer.

10. The fabrication method of claim 6, wherein the step of forming said transistor comprises:

founding a spacer layer along the sidewall of said dummy gate electrode layer; and forming a source/drain region in said substrate laterally adjacent to said dummy gate electrode layer.

11. The fabrication method of claim 10, wherein the step of forming said first trench and said second trench exposes portions of said source/drain region and said substrate adjacent to said first french and said second trench.

12. A method of fabricating a semiconductor device comprising: providing a substrate;

forming a trench in said substrate;

forming a first conductor layer over said substrate and lining said trench;

patterning said first conductor layer for form a capacitor bottom electrode in said trench;

forming a dielectric layer over said patterned first conductor layer;

patterning said dielectric layer to form a transistor gate dielectric and to form a capacitor dielectric;

forming a second conductor layer over said dielectric layer; and patterning said second conductor layer to form a transistor gate electrode and to form a capacitor top plate.

13. The method of claim 12 wherein forming a trench is said substrate comprises forming said trench in said substrate and an insulating layer overlying said substrate.

14. The method of claim 12 wherein said trench is an isolation structure.

15. The method of claim 12 wherein forming a first conductor comprises blanket depositing one or more layers selected from the group consisting essentially of W, WN, Ti, TiW, TiN, Ta, TaN, Al, Cu, Mo, and combinations thereof.

16. The method of claim 13 further comprising:

forming a dummy gate electrode on said substrate;

removing said dummy gate electrode after forming said direct conductor layer, thus leaving an opening; and filling said opening with said second conductor layer.

17. The method of claim 12 further comprising:

forming a doped region in said substrate, the doped region being substantially aligned with said trench and wit said gate electrode.

18. The method of claim 12 wherein patterning the second conductor layer comprises a chemical mechanical polishing step.

19. The method of claim 12 wherein patterning said dielectric layer comprises a chemical mechanical polish step.

20. The method of claim 12 wherein patterning said second conductor layer and patterning said dielectric layer are performed in a single process step.

21. The method of claim 12 wherein patterning said first conductor layer comprises an etch back process.

* * * * *

UNITED STATES PATENT AND TRADEMARK OFFICE
CERTIFICATE OF CORRECTION

PATENT NO.        : 7,271,083 B2
APPLICATION NO.   : 10/896491
DATED             : September 18, 2007
INVENTOR(S)       : Tu et al.

It is certified that error appears in the above-identified patent and that said Letters Patent is hereby corrected as shown below:

On the Title page, Sect. (56) References Cited, delete "Leutzen" and insert --Luetzen--.
In Col. 7, line 67, delete "french" and insert --trench--.
In Col. 8, line 39, delete "farm" and insert --form--.
In Col. 8, line 46, delete "french" and insert --trench--.
In Col. 9, line 1, delete "founding" and insert --forming--.
In Col. 9, line 8, delete "french" and insert --trench--.
In Col. 9, line 14, delete "for" and insert --to--.
In Col. 9, line 24, delete "is" and insert --in--.
In Col. 10, line 13, delete "wit" and insert --with--.

Signed and Sealed this

Eighteenth Day of December, 2007

JON W. DUDAS
*Director of the United States Patent and Trademark Office*